(12) United States Patent
Sanchez et al.

(10) Patent No.: US 8,226,770 B2
(45) Date of Patent: Jul. 24, 2012

(54) SUSCEPTOR WITH BACKSIDE AREA OF CONSTANT EMISSIVITY

(75) Inventors: Errol Sanchez, Tracy, CA (US); David K. Carlson, San Jose, CA (US); Craig Metzner, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 315 days.

(21) Appl. No.: 11/744,760

(22) Filed: May 4, 2007

(65) Prior Publication Data

US 2008/0274604 A1 Nov. 6, 2008

(51) Int. Cl.
*C23C 16/00* (2006.01)
*C23F 1/00* (2006.01)
*H01L 21/306* (2006.01)

(52) U.S. Cl. ............... 118/728; 118/730; 156/345.51; 156/345.54; 156/345.55

(58) Field of Classification Search ............ 118/724, 118/725, 728, 729, 730; 156/345.51, 345.52, 156/345.53
See application file for complete search history.

(56) References Cited

U.S. PATENT DOCUMENTS

| | | | |
|---|---|---|---|
| 5,098,198 A | | 3/1992 | Nulman et al. |
| 5,551,983 A | * | 9/1996 | Shepard et al. ........... 118/723 R |
| 5,599,397 A | * | 2/1997 | Anderson et al. ............ 118/728 |
| 5,834,059 A | | 11/1998 | Anderson et al. |
| 5,916,370 A | * | 6/1999 | Chang ........................... 118/729 |
| 6,130,105 A | | 10/2000 | Redinbo et al. |
| 6,455,814 B1 | | 9/2002 | Samoilov et al. |
| 6,833,322 B2 | | 12/2004 | Anderson et al. |
| 2004/0255868 A1 | * | 12/2004 | AmRhein et al. ............. 118/728 |
| 2005/0223994 A1 | * | 10/2005 | Blomiley et al. ............. 118/725 |
| 2005/0229853 A1 | * | 10/2005 | Raffin et al. .................. 118/725 |
| 2006/0243209 A1 | | 11/2006 | Blomiley et al. |

FOREIGN PATENT DOCUMENTS

JP 62101021 A * 5/1987

OTHER PUBLICATIONS

English Machine Translation of JP62-101021 Performed and printed on May 12, 2010 from http://www4.ipdl.inpit.go.jp.*

* cited by examiner

*Primary Examiner* — Maureen Gramaglia
*Assistant Examiner* — Tiffany Nuckols
(74) *Attorney, Agent, or Firm* — Diehl Servilla LLC

(57) ABSTRACT

Methods and apparatus for providing constant emissivity of the backside of susceptors are provided. Provided is a susceptor comprising: a susceptor plate having a surface for supporting a wafer and a backside surface opposite the wafer supporting surface; a layer comprising an oxide, a nitride, an oxynitride, or combinations thereof located on the backside surface of the susceptor plate, the layer being stable in the presence of a reactive process gas. The layer comprises, for example, silicon dioxide, silicon nitride, silicon oxynitride, or combinations thereof. Also provided is a method comprising: providing a susceptor in a deposition chamber, the susceptor comprising a susceptor plate and a layer comprising an oxide, a nitride, an oxynitride, or combinations thereof, the layer being stable in the presence of the reactive process gases; locating the wafer on a support surface of the susceptor plate. The method can further comprises selectively depositing an epitaxial layer or a non-epitaxial layer on a surface of the wafer. The method further comprises selectively etching to maintain the oxide, nitride, oxynitride, or combinations thereof layer.

12 Claims, 2 Drawing Sheets

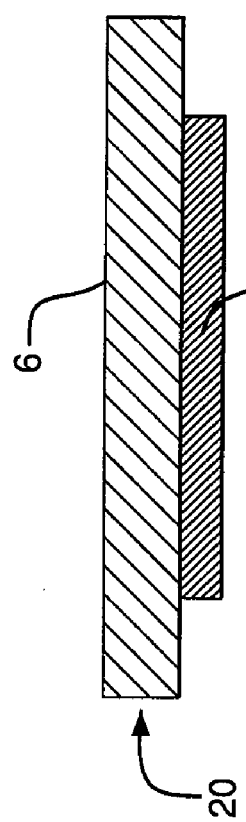
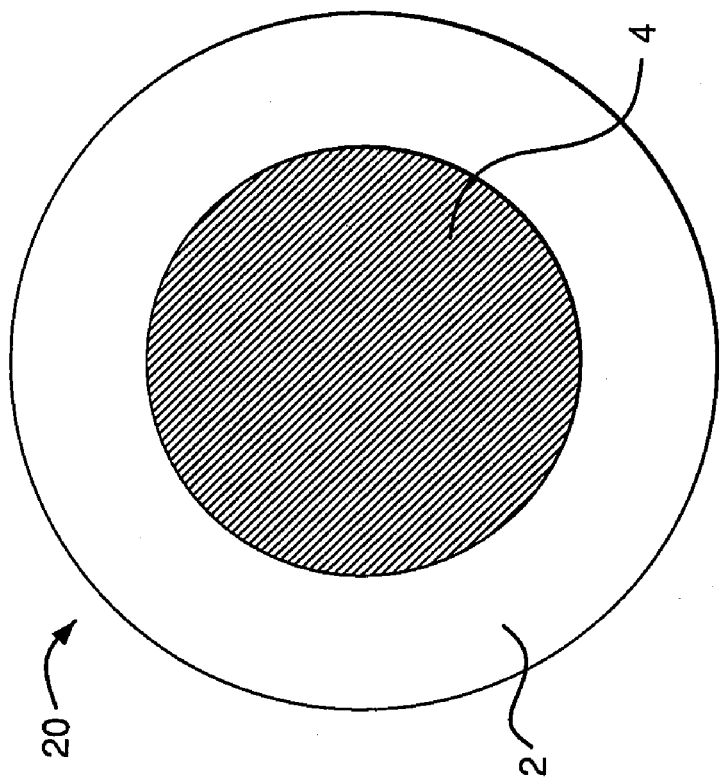

SUSCEPTOR WITH BACKSIDE AREA OF CONSTANT EMISSIVITY

FIELD

Process chambers for semiconductor wafers and susceptors for supporting semiconductor wafers are provided. More particularly, methods and apparatus for processing semiconductor wafers are provided, the methods and apparatus using susceptors having an area of substantially constant emissivity in the presence of reactive process gases.

BACKGROUND

One type of processing apparatus for semiconductor wafers is a single wafer processor in which one wafer at a time is supported on a susceptor in a processing chamber. The susceptor divides the chamber into one portion which is below the susceptor (the lower portion), and a second portion which is above the susceptor (the upper portion). The susceptor is generally mounted on a shaft which rotates the susceptor about its center to achieve a more uniform processing of the wafer. A flow of a processing gas, such as a deposition gas, is provided in the upper portion of the chamber and across the surface of the wafer. The chamber generally has a gas inlet port at one side thereof, and a gas outlet port at an opposite side to achieve a flow of the processing gas across the wafer. The susceptor is heated in order to heat the wafer to a desired processing temperature. One method used to heat the susceptor is by the use of lamps provided around the chamber and directing their light into the chamber and onto the susceptor. In order to control the temperature to which the wafer is being heated, the temperature of the susceptor is constantly measured. This is often achieved by means of an infrared temperature sensor which detects the infra-red radiation emitted from the heated susceptor.

With this type of processing apparatus, some of the processing gas, which is often a gas or mixture of gases for depositing a layer of a material on the surface of the wafer, tends to flow around the edge of the susceptor and deposits a layer of the material on the back surface of the susceptor. Since the deposited material is generally different from the material of the susceptor, the deposited layer has an emissivity which is different from that of the emissivity of the susceptor. Thus, once the layer of the material is deposited on the back surface of the susceptor, the infrared temperature sensor detects a change caused by the change in the emissivity of the surface from which the infra-red radiation is emitted. This change indicates a change in temperature of the susceptor which actually does not exist.

There is a need, therefore, to provide apparatus and methods which ensure constant emissivity of the backside of susceptors. There is a continuing need to achieve uniform temperature of susceptors, and thereby achieve uniform selective epitaxial- and non-epitaxial (e.g., poly-silicon) deposition.

SUMMARY

Susceptors having an area of substantially constant emissivity and apparatus containing these susceptors are provided. In one aspect, a susceptor for an apparatus for depositing a layer of a material on a wafer comprises: a susceptor plate having a surface for supporting a wafer and a backside surface opposite the wafer supporting surface; a layer comprising an oxide, a nitride, an oxynitride, or combinations thereof located on the backside surface of the susceptor plate, the layer being stable in the presence of a reactive process gas.

In one embodiment, the layer comprises silicon. In one or more embodiments, the layer comprises silicon dioxide, silicon nitride, silicon oxynitride, or combinations thereof.

In an embodiment, the layer has a radius that is substantially the same as the radius of the susceptor. In a detailed embodiment, the radius is in the range of 25 to 150 mm, 25 to 100 mm, or even 25 to 50 mm.

One or more embodiments provide that the reactive process gas comprises hydrogen chloride, chlorine, a silicon-containing gas, diborane, phosphine, germanium, arsine, hydrogen, or combinations thereof. In certain embodiments, the silicon-containing gas is selected from the group consisting of: dichlorosilane, silane, disilane, and trisilane. The carrier gas can be either reactive, for example, hydrogen, or inert, for example, nitrogen, argon, or helium.

In one embodiment, the susceptor plate comprises graphite, and optionally, a silicon carbide coating. Other susceptors may comprise silicon carbide.

In another aspect, provided is an apparatus for depositing a layer of material on a surface of a wafer, the apparatus comprising: a deposition chamber; an inlet for a reactive process gas; a susceptor plate extending across the deposition chamber and having a surface for supporting a wafer and a backside surface opposite the wafer supporting surface; and a layer comprising an oxide, a nitride, an oxynitride, or combinations thereof located on the backside surface of the susceptor plate, the layer being stable in the presence of a reactive process gas.

In one embodiment, the apparatus further comprises an infrared temperature sensor facing the backside surface of the susceptor plate and adapted to detect radiation emitted from the susceptor when the susceptor is heated. In a detailed embodiment, the layer covers an area on the susceptor plate that substantially coincides with a viewing area of the infrared temperature sensor.

A further aspect provides a semiconductor method comprising: providing a susceptor in a deposition chamber, the susceptor comprising a susceptor plate and a layer comprising an oxide, a nitride, an oxynitride, or combinations thereof, the layer being stable in the presence of the reactive process gases; and locating the wafer on a support surface of the susceptor plate.

In one embodiment, the method further comprises selectively depositing an epitaxial layer or a non-epitaxial layer on a surface of the wafer. In one or more embodiments, the method further comprises etching unwanted deposits at a temperature of the susceptor plate in the range of 500 to 850° C., or even 650-750° C. In another embodiment, the method further comprises flowing a selective etching gas into the deposition chamber and across the backside surface of the susceptor plate to maintain the layer. In one or more embodiments, the selective etching gas is supplied independently to the backside of the susceptor.

Another embodiment provides that a selective etching gas flows into the deposition chamber and across the backside of the susceptor plate to maintain the layer wherein a temperature of the susceptor plate in the range of 800 to 1000° C. A further embodiment provides that the method further comprises flowing a selective etching gas after processing a plurality of wafers.

Another embodiment provides that the method further comprises monitoring the temperature of the susceptor plate with an infrared temperature sensor that detects radiation emitted from the susceptor plate when the susceptor plate is heated.

In one embodiment, the method further comprises forming the layer such that the layer covers an area on the susceptor plate that substantially coincides with a viewing area of the infrared temperature sensor.

BRIEF DESCRIPTION OF THE FIGURES

The teachings of the present invention can be readily understood by considering the following detailed description in conjunction with the accompanying drawings, in which:

FIG. 1A is a schematic of a backside of a susceptor;

FIG. 1B is a schematic of a side view of a susceptor; and

DETAILED DESCRIPTION

Figure 2:
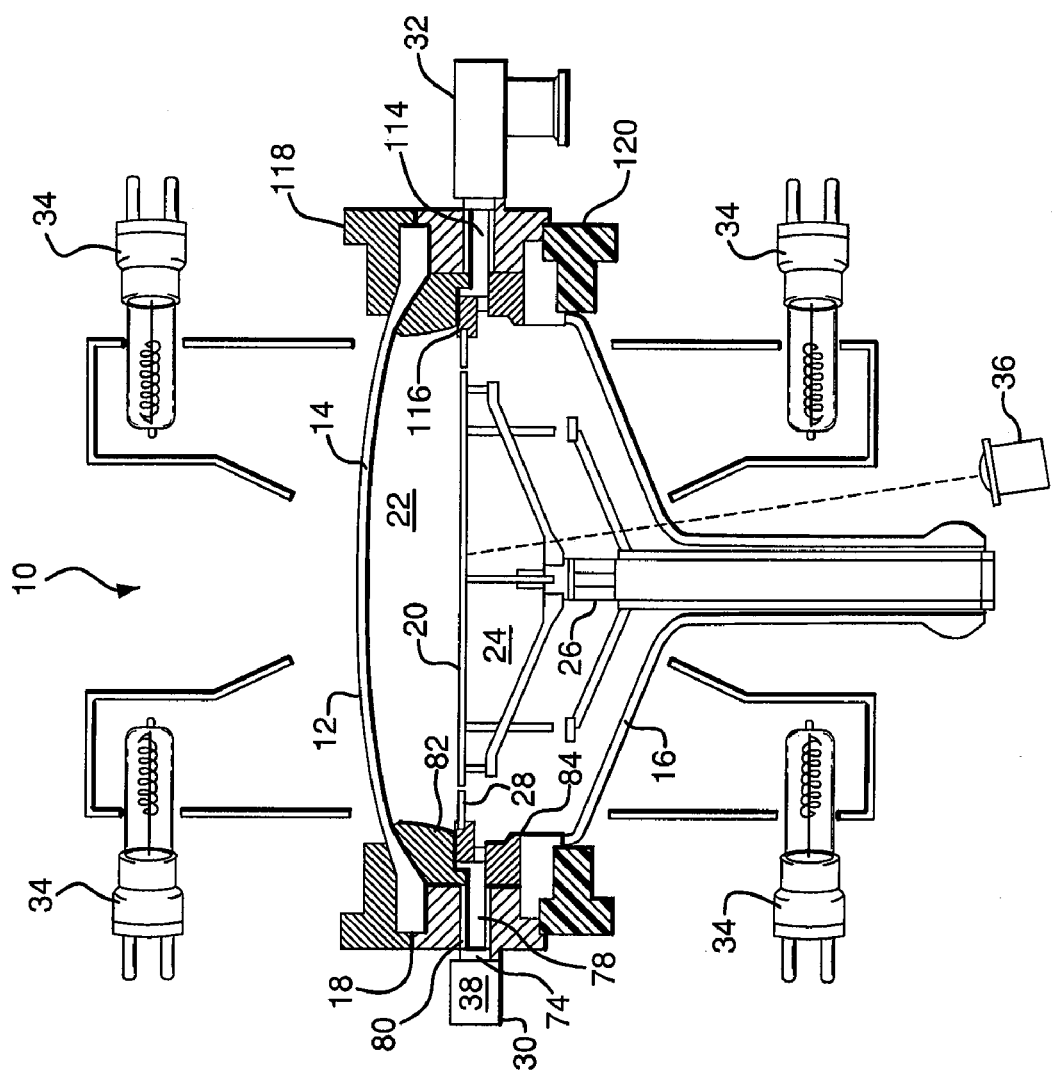
FIG. 2 is a sectional view of a semiconductor wafer processing apparatus.

In the following description, specific details are set forth in order to provide a thorough understanding of the invention. It will be appreciated, however, by one skilled in the art, that the invention may be practiced without these specific details. In other instances, well-known elements have not been shown in order to avoid unnecessarily obscuring the invention.

Methods and apparatus for providing constant emissivity of the backside of susceptors are provided. For selective processes, in one example, silicon deposits on silicon or silicon carbide surfaces, but not on oxide or nitride surfaces. A layer comprising an oxide, a nitride, or both on the backside of a susceptor provides a target measurement area for temperature because the layer remains constant during selective processes. That is, film growth is inhibited on such a layer. The layer, therefore, provides constant emissivity despite the process of selective deposition being applied to a wafer.

In FIG. 1A, a schematic of a backside of a susceptor is provided. The susceptor 20 has a layer 4 comprising an oxide, a nitride, an oxynitride, or combinations thereof on the backside. In one embodiment, an area of the backside being free of a layer 2 is provided. In certain embodiments, on the other hand, it may be desirable that the layer substantially covers the backside of the susceptor.

In FIG. 1B, a schematic of a side-view of a susceptor is provided. The susceptor 20 has the layer 4 comprising the oxide, the nitride, the oxynitride, or combinations thereof. A surface 6 of the susceptor is used for supporting a semiconductor wafer.

Referring to FIG. 2, a semiconductor wafer processing apparatus in accordance with the present invention is generally designated as 10. The processing apparatus 10 shown is a deposition reactor and comprises a deposition chamber 12 having an upper dome 14, a lower dome 16 and a side wall 18 between the upper and lower domes 14 and 16. The upper and lower domes 14 and 16 are made of a transparent material to allow heating light to pass therethrough into the chamber 12. Within the chamber 12 is a flat, circular susceptor 20. The susceptor 20 extends transversely across the chamber 12 at the side wall 18 to divide the chamber 12 into an upper portion 22 above the susceptor 20 and a lower portion 24 below the susceptor 20. The susceptor 20 is mounted on a shaft 26 which extends perpendicularly downwardly from the center of the bottom of the susceptor 20. The shaft 26 is connected to a motor (not shown) which rotates the shaft and thereby rotates the susceptor. An annular pre-heat ring 28 is connected at its outer periphery to the side wall 18 and extends around the susceptor 20. The pre-heat ring 28 is in the same plane as the susceptor 20 with the inner edge of the pre-heat ring 28 being close to the outer edge of the susceptor 20.

An inlet manifold 30 is in the side wall 18 and is adapted to admit processing gases into the chamber 12. The inlet manifold 30 has a flat cap plate 38. A baffle plate 74 extends across a front surface of the cap plate 38. The baffle plate 74 is rectangular to match the size and shape of the front surface. The cap plate 38 and baffle plate 74 are seated against a pair of insert plates 80 which extend through an opening 78 in the side wall 18 to upper and lower liners 82 and 84 respectively. The liners 82 and 84 are mounted against the inside surface of the side wall 18.

An outlet port 32 is in the side wall 18 diagonally opposite the inlet manifold and is adapted to exhaust gases from the deposition chamber 12. Substantially diagonally across the susceptor 20, the lower liner 84 has an exhaust passage 114 therethrough from the outlet port 32. The exhaust passage 114 opens to an outlet passage 116 which is between the lower liner 84 and upper liner 82 and opens into the upper portion 22 of the deposition chamber 12. Thus, gases in the deposition chamber 12 flow therefrom through the outlet passage 116 and exhaust passage 114 to the outlet port 32 to exhaust the deposition chamber 12. Gases in the upper portion 22 of the deposition chamber 12 are exhausted by flowing directly through the exhaust passage 114, outlet passage 116 and outlet port 32. Gases in the lower portion 24 of the deposition chamber 12 are exhausted by flowing around the edge of the susceptor 20 into the upper chamber 22 and then flowing through the exhaust passage 114, outlet passage 116 and outlet port 32.

An upper clamping ring 118 extends around the periphery of the outer surface of the upper dome 14. A lower clamping ring 120 extends around the periphery of the outer surface of the lower dome 16. The upper and lower clamping rings 118 and 120 are secured together so as to clamp the upper and lower domes 14 and 16 to the side wall 18.

A plurality of high intensity lamps 34 are mounted around the chamber 12 and direct their light through the upper and lower domes 14 and 16 onto the susceptor 20 to heat the susceptor 20. The upper and lower domes 14 and 16 are made of a material which is transparent to the light from the lamps 34, such as clear quartz. The upper and lower domes 14 and 16 are generally made of quartz because quartz is transparent to light of both visible and IR frequencies; it exhibits a relatively high structural strength; and it is chemically stable in the process environment of the deposition chamber 12. An infrared temperature sensor 36 is mounted below the lower dome 16 and faces the bottom surface of the susceptor 20 through the lower dome 16. The temperature sensor 36 is used to monitor the temperature of the susceptor 20 by receiving infra-red radiation emitted from the susceptor 20 when the susceptor 20 is heated.

In the operation of the apparatus 10 for the deposition of selective epitaxial and non-epitaxial silicon-containing films on the surface of a wafer, an initial step is to provide a susceptor 20 with a layer comprising an oxide, a nitride, or both located on the backside of the susceptor, the layer being stable in the presence of reactive process gases.

Reference to "oxide/nitride/oxynitride layer" means a layer comprising an oxide, a nitride, an oxynitride, or combinations thereof. The oxide/nitride/oxynitride layer remains free of any coating during selective deposition due film growth inhibited by such a layer. The oxide/nitride/oxynitride layer may be comprised of more than one layer, for example, an oxide layer may be deposited on a nitride layer. The oxide/nitride/oxynitride layer, on the other hand, having combinations present may be a single layer having two or more of the oxide, the nitride, the oxynitride.

The reactive gases include, but are not limited to, one or more of the following: hydrogen chloride (HCl); chlorine ($Cl_2$); a reactive silicon-containing gas (i.e., silane ($SiH_4$), disilane ($Si_2H_6$), trisilane ($Si_3H_8$), dichlorosilane ($SiCl_2$), and generally polysilanes); diborane ($B_2H_6$); phosphine ($PH_3$); germanium (Ge), arsine ($AsH_3$), and hydrogen ($H_2$). The selective epitaxial and non-epitaxial silicon-containing films include, but are not limited to, doped and undoped silicon (Si), silicon-germanium (Si—Ge), and silicon-carbon (Si—C). Suitable oxides, nitrides, and oxynitrides include, but are not limited to, silicon dioxide ($SiO_2$), other silicon oxides ($SiO_x$), silicon nitride ($Si_3N_4$), other silicon nitrides ($Si_aN_b$), and silicon oxynitrides ($SiO_xN_y$).

Using selective deposition of a selective Si—Ge film on a wafer as an example, reactive gases for the process can include: silane, germanium, and Cl-bearing gases such as HCl or $Cl_2$. A layer of, for example, silicon dioxide ($SiO_2$) present on the back surface of the susceptor 20, is stable in the presence of these reactive gases. Moreover, growth of the Si—Ge film on the $SiO_2$ layer is inhibited. As a result, the backside of the susceptor having the $SiO_2$ layer remains substantially free of any coating from the selective deposition process.

Susceptors are typically formed from graphite or silicon-carbide (SiC). In some instances, graphite-based susceptors are coated with silicon carbide. The oxide/nitride/oxynitride layer on the backside of the susceptor can be of any thickness and radius that is needed to achieve uniform temperature. The area that the layer covers should be large enough to cover the viewing are of a temperature sensor associated with, for example, a pyrometer. The area can be adjusted to achieve uniform temperature. For example, diameter of the oxide/nitride/oxynitride layer can be used as a tuning variable, as a heat sink, for example, to control a thickness profile of the film deposited on the wafer. Having constant emissivity of the oxide/nitride/oxynitride layer leads to a highly repeatable temperature control from wafer to wafer. This, in turn, results in uniform selective epitaxial and non-epitaxial (e.g., polysilicon) deposition. Moreover, this eliminates the need to clean and intentionally coat the backside (with, for example, a material that is the same as the deposition material, for example, polysilicon) for process repeatability. Throughput is therefore improved.

Layers of oxides and/or nitrides and/or oxynitrides are formed on the susceptor using processes traditionally used to put these types of layers onto wafers. For example, silicon dioxide or silicon nitride can be deposited on the susceptor using traditional methods of chemical vapor deposition (CVD).

The purpose of coating the back surface of the susceptor 20 with a layer comprising an oxide, a nitride, or both is to provide for good and accurate control of the temperature of the susceptor 20 during the time that material is being selectively deposited on the wafer. During selective epitaxial and non-epitaxial deposition of material on the surface of the wafer, some of the deposition gases in the upper portion 14 of the deposition chamber 12 will leak between the susceptor 20 and the pre-heat ring 28 and will flow into the lower portion 24 of the deposition chamber 12. Such leaking gases will contact the back surface of the susceptor 20 and, in the absence of the layer comprising an oxide, a nitride, or both will deposit a layer of the material on the back surface of the susceptor 20. During this deposition process, the temperature of the susceptor 20 is being monitored by the temperature sensor 36. A factor that affects the reading of the temperature sensor 36 is the emissivity of the susceptor 20. By first coating the back surface of the susceptor 20 with the layer comprising an oxide, a nitride, or both, the temperature sensor 36 is initially calibrated to the emissivity of the coated oxide/nitride/oxynitride layer. Because this oxide/nitride/oxynitride layer is stable in the presence of the reactive process gases and the films being deposited are inhibited from growing on oxide/nitride/oxynitride surfaces, this layer remains essentially unchanged during the selective deposition process on the wafer. The temperature sensor 36, therefore, sees the same initially-calibrated emissivity, and there is no change in the indication of the temperature of the susceptor 20 during processing. This is despite the tendency of the reactive gases to flow into the lower portion 24 of the chamber and contact the oxide/nitride/oxynitride layer on the back surface of the susceptor 20. Only changes in the actual temperature of the susceptor 20 will be indicated by the temperature sensor 36, and not false indications of changes as a result of a material being coated in the back surface of the susceptor 20.

It is desirable that the coated layer be of a thickness of approximately 0.1 to 10 microns, or even 1-3 microns in order to have consistent energy emission from the susceptor backside.

It may be desirable to clean the surfaces of the susceptor 20 by removing any previous coatings on the surfaces thereof. This is achieved by admitting an etching gas, such as hydrogen chloride or chlorine, into the chamber 12. The hydrogen chloride could be admitted into both the upper and lower portions 22 and 24 of the deposition chamber 12 so as to contact both surfaces of the susceptor 20. The susceptor 20 is heated to a relatively high temperature, about 1200° C. The hydrogen chloride will then etch away any previous coatings on the surfaces of the heated susceptor 20. Moreover, it may be desirable to periodically clean the susceptor after multiple selective deposition processes. For example, it may be desirable to etch after every 25 to 100 wafers.

After the susceptor 20 having the oxide/nitride/oxynitride layer is provided in the processing chamber, individual wafers are feed one at a time into the upper portion 22 of the deposition chamber 12 and onto the upper surface of the susceptor 20. The wafers are fed into the deposition chamber 12 through a suitable door, not shown. A layer of material, such as doped silicon, is then coated on the individual wafers. During this process, the susceptor 20 and wafer are heated by the lamps 34 to a temperature at which the gases passing over the wafer are reacted to deposit a layer of material on the surface of the wafer.

During the deposition of material on the surface of the wafer, it is generally desirable to provide a flow of an inert purge gas, such as hydrogen, into the lower portion 24 of the deposition chamber 12 at a pressure slightly greater than the pressure of the gases in the upper portion 22 of the chamber 12. The purge gas will seep between the susceptor 20 and the pre-heat ring 28 and flow into the upper portion 22 of the deposition chamber 12. This limits the flow of the deposition gases from the upper portion 22 to the lower portion 24 of the deposition chamber 12. In the apparatus 10, this is achieved by providing a flow of, for example, hydrogen through an inlet port into the chamber 12.

There is provided by the present invention a deposition apparatus for semiconductor wafers during selective epitaxial and non-epitaxial deposition of a wafer, a susceptor having a layer comprising an oxide, a nitride, an oxynitride, or combinations thereof is provided to support the wafer during deposition. This provides the back surface of the susceptor with an emissivity which does not change during the deposition process as a result of the layer being stable in the presence of reactive gases and the layer not being suitable for the growth of the selective films. This, in turn, permits the monitoring of the temperature of the susceptor with an infrared temperature sensor without causing a false change in the temperature detected as a result of a change in the emissivity of the back surface of the susceptor 20.

The following prophetic examples may be carried out in a Centura® platform provided by Applied Materials, Inc. located in Santa Clara, Calif. Experiments may be conducted on 300 mm susceptors and/or wafers.

EXAMPLE 1

First, a silicon wafer is calibrated to a thermocouple at constant power distribution. A silicon oxide wafer is placed in a deposition chamber under conditions of constant power distribution and an infrared temperature sensor is be used to measure the change in emissivity. A silicon nitride wafer is placed in a deposition chamber under conditions of the same constant power distribution and an infrared temperature sensor is used to measure the change in emissivity. The emissivities of each wafer will be used to correlate silicon species and etch species to changes in emissivity.

EXAMPLE 2

A silicon carbide wafer is coated with a film of one or more oxides, such as silicon oxide. The emissivity characteristics are measured with an infrared temperature sensor. Film stability is evaluated using constant emissivity over time at a constant power distribution.

EXAMPLE 3

Backsides of one or more standard silicon carbide susceptors are coated with one or more layers of material from in Example 2 having acceptable film stability. These modified susceptors are tested for process performance and long term stability under conditions of constant power distribution and measuring change in emissivity.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An apparatus for depositing material on a surface of a wafer, the apparatus comprising:
    a deposition chamber;
    an inlet for a reactive process gas to form deposited material within the chamber;
    a susceptor plate extending across the deposition chamber and having a surface for supporting a wafer and a backside surface opposite the wafer supporting surface;
    an infrared temperature sensor facing the backside of the susceptor to provide a viewing area for the temperature sensor; and
    a layer comprising an oxide, a nitride, an oxynitride, or combinations thereof covering an area consisting of only a portion of the backside surface of the susceptor plate, wherein the layer has a radius less than a radius of the susceptor plate such that a portion of the backside surface of the susceptor plate is free of the layer, the layer being stable in the presence of a reactive process gas and effective to inhibit deposited material from forming a film on the layer.

2. The apparatus of claim 1, wherein the layer comprises silicon.

3. The apparatus of claim 1, wherein the layer has a radius in the range of 25 to 50 mm.

4. The apparatus of claim 1, wherein the reactive process gas comprises hydrogen chloride, chlorine, a silicon-containing gas, diborane, phosphine, germanium, arsine, hydrogen, or combinations thereof.

5. The apparatus of claim 4, wherein the reactive process gas comprises a silicon-containing gas selected from the group consisting of: dichlorosilane, silane, disilane, and trisilane.

6. The apparatus of claim 1, wherein the susceptor plate comprises graphite.

7. The apparatus of claim 6, wherein the susceptor plate has a silicon carbide coating.

8. The apparatus of claim 1, wherein the susceptor plate comprises silicon carbide.

9. The apparatus of claim 1, wherein the layer comprises silicon dioxide, silicon nitride, silicon oxynitride, or combinations thereof.

10. The apparatus of claim 1, wherein the infrared temperature sensor facing the backside surface of the susceptor plate is adapted to detect radiation emitted from the susceptor when the susceptor is heated.

11. The apparatus of claim 10, wherein the layer covers an area on the susceptor plate that substantially coincides with the viewing area of the infrared temperature sensor.

12. The apparatus of claim 1, wherein the infrared temperature sensor is calibrated to the emissivity of the layer.

* * * * *